(12) United States Patent
Chew et al.

(10) Patent No.: US 11,113,129 B2
(45) Date of Patent: Sep. 7, 2021

(54) REAL TIME BLOCK FAILURE ANALYSIS FOR A MEMORY SUB-SYSTEM

(71) Applicant: Micron Technology, Inc., Boise, ID (US)

(72) Inventors: Francis Chew, Boulder, CO (US); Gerald L. Cadloni, Longmont, CO (US); Bruce A. Liikanen, Berthoud, CO (US)

(73) Assignee: Micron Technology, Inc., Boise, ID (US)

( * ) Notice: Subject to any disclaimer, the term of this patent is extended or adjusted under 35 U.S.C. 154(b) by 158 days.

(21) Appl. No.: 16/035,320

(22) Filed: Jul. 13, 2018

(65) Prior Publication Data
US 2020/0019453 A1 Jan. 16, 2020

(51) Int. Cl.
*G06F 11/07* (2006.01)
*G11C 29/44* (2006.01)

(52) U.S. Cl.
CPC .......... *G06F 11/073* (2013.01); *G06F 11/076* (2013.01); *G11C 29/44* (2013.01)

(58) Field of Classification Search
CPC .. G06F 11/073; G06F 11/076; G06F 11/1008; G11C 29/44; G11C 29/021; G11C 29/52; G11C 29/028; G11C 29/04
See application file for complete search history.

(56) References Cited

U.S. PATENT DOCUMENTS

| | | | |
|---|---|---|---|
| 9,092,350 B1 * | 7/2015 | Jeon | G06F 11/004 |
| 9,153,336 B1 | 10/2015 | Yang et al. | |
| 9,355,735 B1 * | 5/2016 | Chen | G11C 16/08 |
| 9,454,420 B1 | 9/2016 | Tai et al. | |
| 9,558,850 B1 | 1/2017 | Bialas et al. | |
| 9,761,308 B1 | 9/2017 | Cometti | |
| 10,140,040 B1 | 11/2018 | Koudele et al. | |
| 10,170,195 B1 | 1/2019 | Ioannou et al. | |
| 10,379,739 B1 | 8/2019 | Bazarsky et al. | |
| 10,388,376 B2 | 8/2019 | Molas et al. | |
| 2002/0152459 A1 | 10/2002 | Bates et al. | |

(Continued)

FOREIGN PATENT DOCUMENTS

GB    2383455 A  *  6/2003  ............. G11C 29/50

OTHER PUBLICATIONS

International Application No. PCT/US2018/033873—International Search Report & Written Opinion, dated Sep. 7, 2018, 9 pages.

(Continued)

*Primary Examiner* — Yolanda L Wilson
(74) *Attorney, Agent, or Firm* — Perkins Coie LLP

(57) ABSTRACT

Several embodiments of memory devices and systems for real time block failure analysis are disclosed herein. In one embodiment, a system includes a memory array including a plurality of memory cells and a processing device coupled to the memory array. The processing device is configured to sense, in response to detection of an error associated with a subset of a plurality of memory cells of the memory device, a state associated with each memory cell of the subset of the plurality of memory cells. The processing device is further configured to store state distribution information in a persistent memory, the state distribution information comprising the sensed state associated with each memory cell of the subset.

18 Claims, 9 Drawing Sheets

(56) References Cited

U.S. PATENT DOCUMENTS

| | | |
|---|---|---|
| 2005/0201148 A1 | 9/2005 | Chen et al. |
| 2006/0277429 A1 | 12/2006 | Dasari et al. |
| 2007/0025167 A1* | 2/2007 | Ziegelmayer .... G11C 29/50004 365/201 |
| 2009/0055680 A1 | 2/2009 | Honda et al. |
| 2010/0073069 A1 | 3/2010 | Wang et al. |
| 2010/0097857 A1 | 4/2010 | Cernea |
| 2010/0188919 A1 | 7/2010 | Fox et al. |
| 2011/0119431 A1 | 5/2011 | Chowdhury |
| 2011/0167307 A1 | 7/2011 | Mori |
| 2011/0305090 A1 | 12/2011 | Roohparvar et al. |
| 2012/0030531 A1* | 2/2012 | Brewerton ........... G11C 29/024 714/719 |
| 2012/0213001 A1 | 8/2012 | Yang |
| 2012/0236653 A1 | 9/2012 | Spessot et al. |
| 2012/0254699 A1 | 10/2012 | Ruby et al. |
| 2013/0007543 A1 | 1/2013 | Goss et al. |
| 2013/0024743 A1 | 1/2013 | Sharon et al. |
| 2013/0117604 A1* | 5/2013 | Ha ........................ G11C 29/44 714/6.32 |
| 2013/0132652 A1 | 5/2013 | Wood et al. |
| 2013/0227200 A1 | 8/2013 | Cometti et al. |
| 2013/0346805 A1 | 12/2013 | Sprouse et al. |
| 2014/0136928 A1 | 5/2014 | Mu et al. |
| 2014/0157065 A1* | 6/2014 | Ong .................... G06F 15/7821 714/718 |
| 2014/0281661 A1 | 9/2014 | Milton et al. |
| 2014/0281767 A1 | 9/2014 | Alhussien et al. |
| 2015/0036432 A1 | 2/2015 | Huang |
| 2015/0085573 A1 | 3/2015 | Sharon et al. |
| 2015/0154064 A1* | 6/2015 | Ghaly .................. G06F 11/076 714/6.11 |
| 2015/0309858 A1 | 10/2015 | Weilemann et al. |
| 2015/0378415 A1 | 12/2015 | George |
| 2016/0041891 A1* | 2/2016 | Malshe ............... G06F 11/1048 714/704 |
| 2016/0092496 A1 | 3/2016 | Dietterich et al. |
| 2016/0117216 A1 | 4/2016 | Muchherla et al. |
| 2016/0132256 A1 | 5/2016 | Jung |
| 2016/0133334 A1 | 5/2016 | Zhang et al. |
| 2016/0147582 A1 | 5/2016 | Karakulak et al. |
| 2016/0148701 A1 | 5/2016 | Karakulak et al. |
| 2016/0148702 A1 | 5/2016 | Karakulak et al. |
| 2016/0148708 A1* | 5/2016 | Tuers ..................... G11C 29/38 714/719 |
| 2016/0162185 A1* | 6/2016 | D'Abreu ................ G11C 16/10 711/103 |
| 2016/0179406 A1 | 6/2016 | Gorobets et al. |
| 2016/0218740 A1 | 7/2016 | Parthasarathy et al. |
| 2016/0259693 A1 | 9/2016 | Sundararaman et al. |
| 2016/0266792 A1 | 9/2016 | Amaki et al. |
| 2017/0053714 A1 | 2/2017 | Guy et al. |
| 2017/0091039 A1 | 3/2017 | Hong |
| 2017/0097868 A1 | 4/2017 | Kim et al. |
| 2017/0148510 A1 | 5/2017 | Bazarsky et al. |
| 2017/0241843 A1 | 8/2017 | Jeon et al. |
| 2017/0263311 A1 | 9/2017 | Cometti |
| 2017/0269991 A1 | 9/2017 | Bazarsky et al. |
| 2017/0271031 A1 | 9/2017 | Sharon et al. |
| 2018/0189125 A1 | 7/2018 | Karlik et al. |
| 2018/0277228 A1 | 9/2018 | Takada et al. |
| 2018/0341416 A1 | 11/2018 | Koudele et al. |
| 2018/0341552 A1 | 11/2018 | Liikanen et al. |
| 2018/0341553 A1 | 11/2018 | Koudele et al. |
| 2019/0103164 A1 | 4/2019 | Malshe et al. |
| 2019/0147964 A1 | 5/2019 | Yun et al. |
| 2019/0164599 A1 | 5/2019 | Avraham et al. |
| 2019/0171381 A1 | 6/2019 | Ioannou et al. |
| 2019/0172542 A1 | 6/2019 | Miladinovic |
| 2019/0278653 A1 | 9/2019 | Padilla et al. |
| 2019/0354312 A1 | 11/2019 | Chew et al. |
| 2019/0354313 A1 | 11/2019 | Sheperek et al. |
| 2020/0010459 A1 | 1/2020 | Van Dongen et al. |
| 2020/0019459 A1 | 1/2020 | Cadloni et al. |
| 2020/0117387 A1 | 4/2020 | Cadloni et al. |

OTHER PUBLICATIONS

International Application No. PCT/US2018/033877—International Search Report & Written Opinion, dated Sep. 14, 2018, 22 pages.
International Application No. PCT/US2018/033881—International Search Report & Written Opinion, dated Sep. 14, 2018, 12 pages.
International Application No. PCT/US2019/033179—International Search Report and Written Opinion, dated Sep. 18, 2019, 12 pages.
TW Patent Application No. 107117756—Taiwanese Office Action and Search Report, dated Jan. 31, 2019, 19 pages.
TW Patent Application No. 107117756—Taiwanese Search Report, dated Jul. 22, 2019, with English Translation, 2 pages.
TW Patent Application No. 107117813—Taiwanese Office Action and Search Report, dated Mar. 18, 2019, 17 pages.

* cited by examiner

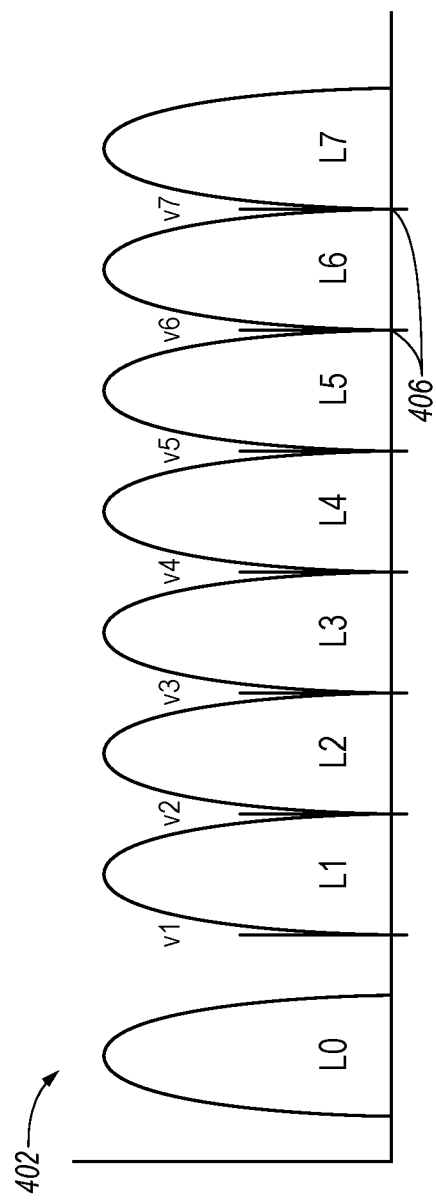
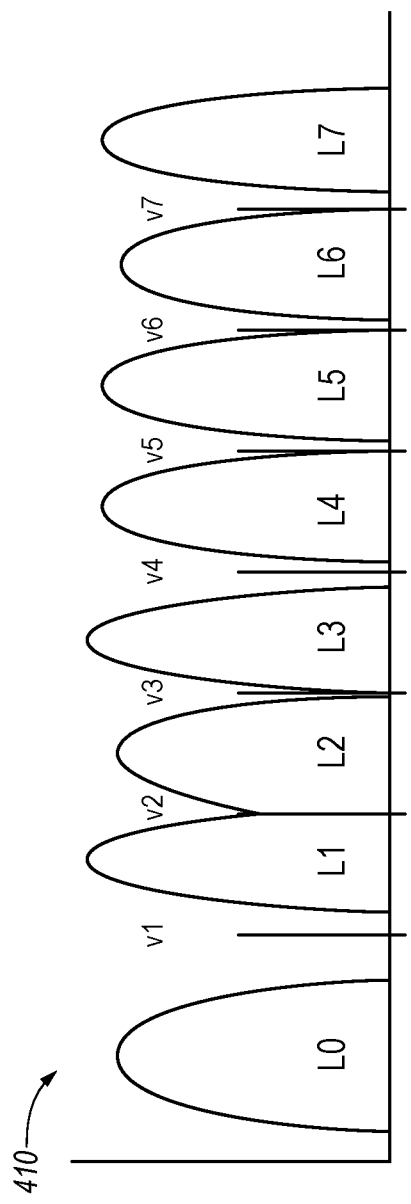

REAL TIME BLOCK FAILURE ANALYSIS FOR A MEMORY SUB-SYSTEM

TECHNICAL FIELD

The disclosed embodiments relate to memory sub-systems, and, in particular, to real time block failure analysis for a memory sub-system.

BACKGROUND

Memory devices can employ flash media to persistently store large amounts of data for a host device, such as a mobile device, a personal computer, or a server. Flash media includes "NOR flash" and "NAND flash" media. NAND-based media is typically favored for bulk data storage because it has a higher storage capacity, lower cost, and faster write speed than NOR media. The memory cells in NAND flash employ a charge storage structure, (e.g., a floating gate structure or a charge trapping structure) for storing charge to represent different data states. The cells are programmed by transferring electrons through a thin dielectric layer (e.g., a tunnel oxide) from a channel to, e.g., a floating gate or a charge trapping layer within the charge storage structure. The amount of charge stored in a memory cell represents one or more threshold voltages that are indicative of the voltage(s) required to form a conductive path within the channel, (e.g., depending on the amount of electrons stored on the floating gate or the charge trapping layer).

One drawback of flash memory and other non-volatile memory is that the threshold voltages of the individual memory cells can change as, over time, the memory device erases and writes data to the memory. For example, over multiple erase and write cycles, electrons can become trapped within the tunnel oxide of a memory cell, causing the threshold voltage(s) of the cell to gradually increase. This phenomenon, if uncorrected, can result in bit errors during a read of the data stored in the memory cell.

In some circumstances, error correcting code (ECC) techniques may be employed to detect and correct bit errors if the number of bit errors does not exceed the correction capacity of the code. Eventually, however, as more electrons are trapped within the tunnel oxide layers of more and more memory cells in a memory device, the number of memory cells with unreadable data states (e.g., due to shifted threshold voltages) may exceed the correction capacity of the ECC. When this happens, the memory controller is no longer able to efficiently or properly read out data from the affected memory regions.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

FIGS. 4A and 4B are diagrams illustrating a number of Vt distributions corresponding to program states associated with programmed memory cells in accordance with embodiments of the present technology.

DETAILED DESCRIPTION

Figure 1:
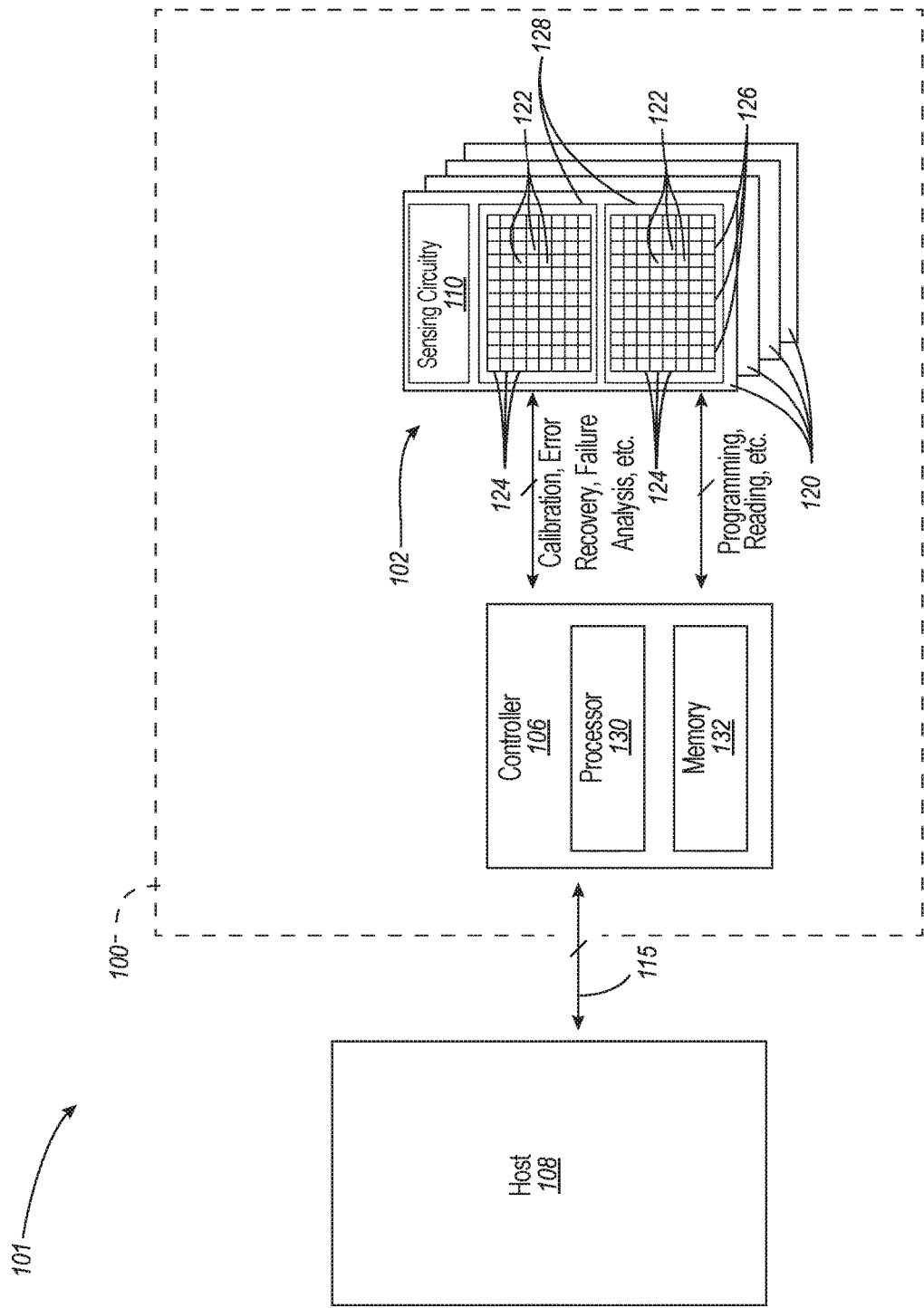
FIG. 1 is a block diagram of a system having a memory device configured in accordance with an embodiment of the present technology.

As described in greater detail below, the present technology relates to the collection of data for memory devices and related systems that have experienced an error and/or failure. A person skilled in the art, however, will understand that the technology may have additional embodiments and that the technology may be practiced without several of the details of the embodiments described below with reference to FIGS. 1-9. In the illustrated embodiments below, the memory devices are described in the context of devices incorporating NAND-based storage media (e.g., NAND flash). Memory devices configured in accordance with other embodiments of the present technology, however, can include other types of memory devices and/or can include main memories that are not NAND-based (e.g., NOR-based) or only partially NAND-based.

One embodiment of the present technology is a system comprising a memory array including a plurality of memory cells and a processing device coupled to the memory array. The processing device is configured to (1) in response to detection of an error associated with a subset of the plurality of memory cells, sense a state associated with each memory cell of the subset of the plurality of memory cells; and (2) store state distribution information in a persistent memory, the state distribution information comprising the sensed state associated with each memory cell of the subset.

The various embodiments of real time block failure analysis described herein involve the immediate or near-immediate collection of state information such as voltage (Vt) distributions of a subset of memory cells (e.g., one or more pages, word lines, blocks, etc.) when it has experienced an error such as a failure that makes the data stored in the subset of memory cells unrecoverable using one or more error recovery processes (e.g., redundant array of inexpensive NAND or RAIN). The immediate or near-immediate collection of such information captures the Vt distributions at a time at or near the time of failure, providing a snapshot in time of the states of memory cells, offering visibility into the states of the memory cells at or near the time of failure for review well after the failure has occurred. This is a significant advantage over collecting failure analysis information long after a failure occurs (e.g., after a memory device has been powered off following a failure).

The Vt distribution information may be collected after one or more error recovery processes have been attempted to reduce the number of instances when the Vt distribution is collected. That is, the system may collect Vt distribution information only in an uncorrectable error (e.g., failure) situation. The Vt distribution information can be stored in persistent memory on the memory device so that it can be recovered and/or analyzed subsequent to the collection of the information (e.g., after the memory device has been powered off). The Vt distribution information may, in addition to or instead of being stored in persistent memory on the memory device, may be sent to another device for storage and/or analysis.

Advantageously, the real time (e.g., simultaneously with the one or more error recovery processes) or near-real time (e.g., within a short delay following the completion or termination of the one or more error recovery processes) capturing of this state distribution information allows the distribution information to reflect the condition of the memory cells at or near a time of error/failure. Certain conditions may not be present after the failure and/or after the memory device is powered off. For example, a temperature of a failing device may drop after the device is switched off. Accordingly, if the temperature was contributing to the failure, distribution information collected after the memory device cools down may not reflect the distribution information at the time of the failure when the memory device was warmer. Thus, the various embodiments described herein provide for state information to be captured closer to or at the time of error/failure of a memory device.

FIG. 1 is a block diagram of a system 101 having a memory sub-system (also hereinafter referred to as a "memory device" (e.g., memory device 100) configured in accordance with an embodiment of the present technology. An example of a memory sub-system is a storage system, such as a solid-state drive (SSD). In some embodiments, the memory sub-system is a hybrid memory/storage sub-system. In general, a host system can utilize a memory sub-system that includes one or more memory components. The host system can provide data to be stored at the memory sub-system and can request data to be retrieved from the memory sub-system. As shown, the memory device 100 includes one or more memory components (e.g., memory component 102 (e.g., NAND flash)) and a controller 106 operably coupling the memory component 102 to a host device 108 (e.g., an upstream central processor (CPU)). The memory component 102 includes a plurality of memory regions, or memory units 120, which each include a plurality of memory cells 122. Memory units 120 can be individual memory dies, memory planes in a single memory die, a stack of memory dies vertically connected with through-silicon vias (TSVs), or the like. In one embodiment, each of the memory units 120 can be formed from a semiconductor die and arranged with other memory unit dies in a single device package (not shown). In other embodiments, one or more of the memory units 120 can be co-located on a single die and/or distributed across multiple device packages. The memory cells 122 can include, for example, floating gate, charge trap, phase change, ferroelectric, magnetoresistive, and/or other suitable storage elements configured to store data persistently or semi-persistently. The memory component 102 and/or the individual memory units 120 can also include other circuit components (not shown), such as multiplexers, decoders, buffers, read/write drivers, address registers, data out/data in registers, etc., for accessing, sensing, and/or programming (e.g., writing) the memory cells 122 and other functionality, such as for processing information and/or communicating with the controller 106.

Memory cells 122 can be arranged in rows 124 (e.g., each corresponding to a word line) and columns 126 (e.g., each corresponding to a bit line). Furthermore, adjacent word lines 124 can be arranged into one or more word line groups that compose a memory block 128. Each word line 124 can span one or more memory pages, depending upon the number of data states the memory cells 122 of that word line 124 are configured to store. For example, a single word line 124 of memory cells 122 in which each memory cell 122 stores one of two data states (e.g., SLC memory cells configured to store one bit each) can span a single memory page. Alternatively, a single word line 124 of memory cells 122 in which each memory cell 122 stores one of four data states (e.g., MLC memory cells configured to store two bits each) can span two memory pages. Moreover, memory pages can be interleaved so that a word line 124 comprised of memory cells 122 configured to store one of two data states in each cell (e.g., SLC memory cells) can span two memory pages, in an "even-odd bit line architecture," where all the memory cells 122 in odd-numbered columns 126 of a single word line 124 are grouped as a first memory page, and all the memory cells 122 in even-numbered columns 126 of the same word line 124 are grouped as a second memory page. When even-odd bit line architecture is utilized in a word line 124 of memory cells 122 that store larger numbers of data states in each cell (e.g., memory cells configured as MLC, TLC, QLC, etc.), the number of memory pages per word line 124 can be even higher (e.g., 4, 6, 8, etc.). Non-binary configurations of memory cells may also be used.

Each column 126 can include a string of series-coupled memory cells 122 coupled to a common source. The memory cells 122 of each string can be connected in series between a source select transistor (e.g., a field-effect transistor) and a drain select transistor (e.g., a field-effect transistor). An example of such a configuration is described below with respect to FIG. 2. Source select transistors can be commonly coupled to a source select line, and drain select transistors can be commonly coupled to a drain select line.

In other embodiments, the memory cells 122 can be arranged in different types of groups and/or hierarchies than those shown in the illustrated embodiments. Further, while shown in the illustrated embodiments with a certain number of memory cells, rows, columns, blocks, and memory units for purposes of illustration, in other embodiments, the number of memory cells, rows, columns, blocks, and memory units can vary, and can be larger or smaller in scale than shown in the illustrated examples. For example, in some embodiments, the memory device 100 can include only one memory unit 120. Alternatively, memory device 100 can include two, three, four, eight, ten, or more (e.g., 16, 12, 64, or more) memory units 120. While the memory units 120 are shown in FIG. 1 as including two memory blocks 128 each, in other embodiments, each memory unit 120 can include one, three, four eight, or more (e.g., 16, 32, 64, 100, 128, 256 or more memory blocks). In some embodiments, each memory block 128 can include, e.g., $2^{15}$ memory pages, and each memory page within a block can include, e.g., $2^{12}$ memory cells 122 (e.g., a "4k" page).

The memory component 102 further includes a sensing component, or sensing circuitry 110 (shown schematically), operably coupled to at least one of the memory units 120. In some embodiments, the sensing circuitry 110 can be located on the same memory die as an individual memory unit 120.

In these and other embodiments, the sensing circuitry 110 may be dedicated to a corresponding memory unit 120 or multiple memory units, including memory units on different die. The sensing circuitry 110 can include circuit components, such as multiplexers, decoders, buffers, read/write drivers, address registers, data out/data in registers, etc. In some embodiments, the sensing circuitry 110 can be circuitry separate from other on-chip circuitry used for accessing, calibrating, performing error recovery, and/or programming (e.g., reading and/or writing) the memory cells 122 and/or for providing other functionality, such as for processing information and/or communication with the controller 106. In other embodiments, the sensing circuitry 110 can be a part of, or coextensive with, the on-chip circuitry used for accessing, calibrating, performing error recovery, and/or programming (e.g., reading and/or writing) the memory cells 122 and/or for providing other functionality. As described herein, the sensing circuitry 110 can be utilized according to various embodiments to sense a state of memory cells 122 (e.g., a threshold voltage (Vt) stored on memory cells) of the memory component 102.

The controller 106 can be a microcontroller, special purpose logic circuitry (e.g., a field programmable gate array (FPGA), an application specific integrated circuit (ASIC), etc.), or other suitable processor. The controller 106 can include a processor 130 configured to execute instructions stored in memory. In the illustrated example, the memory of the controller 106 includes an embedded memory 132 configured to perform various processes, logic flows, and routines for controlling operation of the memory device 100, including managing the memory component 102 and handling communications between the memory device 100 and the host device 108. In some embodiments, the embedded memory 132 can include memory registers storing, e.g., memory pointers, fetched data, etc. The embedded memory 132 can also include read-only memory (ROM) for storing micro-code. While the exemplary memory device 100 illustrated in FIG. 1 has been illustrated as including a controller 106, in another embodiment of the present technology, a memory device may not include a controller, and may instead rely upon external control (e.g., provided by an external host, or by a processor or controller separate from the memory device).

In operation, the controller 106 can directly write or otherwise program (e.g., erase) the various memory regions of the memory component 102, such as by writing to groups of memory pages and/or memory blocks 128. In NAND-based memory, a write operation often includes programming the memory cells 122 in selected memory pages with specific data values (e.g., a string of data bits having a value of either logic 0 or logic 1). An erase operation is similar to a write operation, except that the erase operation re-programs an entire memory block 128 or multiple memory blocks 128 to the same data state (e.g., logic 0).

The controller 106 communicates with the host device 108 over a host-device interface 115. In some embodiments, the host device 108 and the controller 106 can communicate over a serial interface, such as a serial attached SCSI (SAS), a serial AT attachment (SATA) interface, a peripheral component interconnect express (PCIe), or other suitable interface (e.g., a parallel interface). The host device 108 can send various requests (in the form of, e.g., a packet or stream of packets) to the controller 106. A request can include a command to write, erase, return information, and/or to perform a particular operation (e.g., a TRIM operation).

The controller 106 can also calibrate signals used to program and read from the memory component 102. Calibration may be utilized as an error recovery process where memory cells cannot be properly programmed or read. Other error recovery processes may also be utilized such as RAIN recovery operations. In various embodiments described below, the controller 106 can send a failure analysis signal to the sensing circuitry 110 in response to a determination of an error and/or failure in order to instruct the sensing circuitry 110 to sense states associated with the memory cells 122 of one or more memory regions of the memory component 102.

Figure 2:
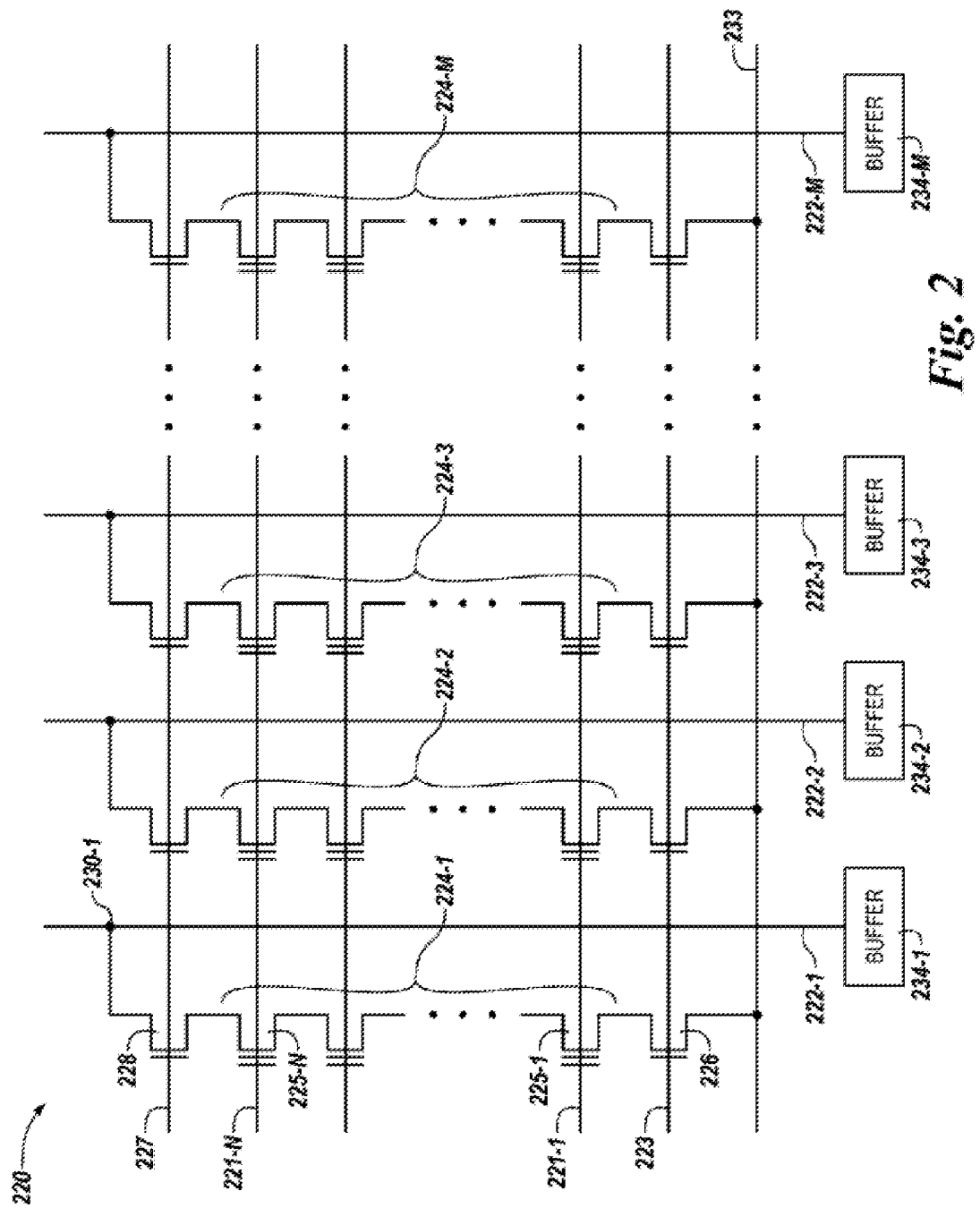
FIG. 2 is a schematic of a portion of an apparatus in the form of a non-volatile memory array configured in accordance with an embodiment of the present technology.

FIG. 2 is a schematic of a portion of an apparatus in the form of a non-volatile memory array 220 in accordance with one or more embodiments of the present disclosure. The embodiment of FIG. 2 illustrates a NAND architecture non-volatile memory array. However, embodiments of memory arrays and/or memory cells described herein are not limited to this example. The memory array 220 shows additional detail of a memory block, such as the memory blocks 128 shown in FIG. 1 and described above. As shown in FIG. 2, the non-volatile memory array 220 includes access lines, e.g., word lines 221-1, . . . 221-N, and intersecting sense lines, e.g., local bit lines 222-1, . . . 222-M. For ease of addressing in the digital environment, the number of word lines 221-1, . . . 221-N and the number of local bit lines 222-1, . . . 222-M can be some power of two, e.g., 256 word lines by 4,096 bit lines, although other numbers of word and bit lines can be used.

The memory array 220 includes NAND strings 224-1, . . . 224-M. Each NAND string includes non-volatile memory cells 225-1, . . . 225-N, each communicatively coupled to a respective access line, e.g., selected from word lines 221-1, . . . 221-N. Each NAND string, and its constituent memory cells, is also associated with a respective sense line, e.g., selected from local bit lines 222-1, . . . 222-M. The memory cells 225-1, . . . 225-N of each NAND string 224-1, . . . 224-M are connected in series source to drain between a source select gate (SGS), e.g., a field-effect transistor (FET) 226, and a drain select gate (SGD), e.g., FET 228. Each source select gate 226 is configured to selectively couple a respective NAND string to a common source 233 responsive to a signal on source select line 223, while each drain select gate 228 is configured to selectively couple a respective NAND string to a respective bit line responsive to a signal on drain select line 227.

As shown in the embodiment illustrated in FIG. 2, a source of source select gate 226 is connected to a common source line 233. The drain of source select gate 226 is connected to the source of the memory cell 225-1 of the corresponding NAND string 224-1. The drain of drain select gate 228 is connected to bit line 222-1 of the corresponding NAND string 224-1 at drain contact 230-1. The source of drain select gate 228 is connected to the drain of the last memory cell 225-N, e.g., a floating-gate transistor, of the corresponding NAND string 224-1.

In one or more embodiments, construction of the non-volatile memory cells 225-1, . . . 225-N includes a source, a drain, a floating gate or other charge storage structure, and a control gate. The memory cells 225-1, . . . 225-N have their control gates coupled to a word line, 221-1, . . . 221-N, respectively. A NOR array architecture would be similarly laid out, except that the string of memory cells would be coupled in parallel between the select gates.

Subsets of memory cells, e.g., selected from those including 225-1, . . . 225-N, coupled to a selected word line, selected from 221-1, . . . 221-N, respectively, can be programmed and/or sensed, e.g., read, together as a group. A number of memory cells programmed and/or sensed together can correspond to a page of data. The sensing of a page of data can be utilized according to the various embodiments described herein to perform failure analysis by sensing state information associated with each of the memory cells in the page of data at or near a time of an error/failure and storing that information for subsequent analysis.

A programming operation, e.g., a write operation, can include applying a number of program pulses, e.g., 16V-20V, to a selected word line in order to increase the Vt of selected memory cells coupled to that selected word line to a desired program voltage level corresponding to a targeted program state.

A sensing operation, such as a read and/or a Vt analysis operation, e.g., using a soft data strobe, can include sensing a voltage and/or current change, e.g., discharge, on a sense line, e.g., a bit line, coupled to a selected memory cell in order to determine the program state and/or the Vt of the selected memory cell. The sensing operation can include precharging a bit line and sensing the discharge when a selected memory cell begins to conduct. A failure or error occurs when a read operation cannot accurately determine the programmed state of a memory cell. Thus, according to the various embodiments herein, a state of the Vt of the memory cells can be sensed.

Sensing to determine the program state and/or the Vt of the selected memory cell can include providing a number of sensing voltages, e.g., read voltages, to a selected word line while providing a number of voltages, e.g., read pass voltages, to the word lines coupled to the unselected memory cells of the string sufficient to place the unselected memory cells in a conducting state independent of the Vt of the unselected memory cells. The bit line corresponding to the selected memory cell being read and/or verified can be sensed to determine whether or not the selected memory cell conducts in response to the particular sensing voltage applied to the selected word line.

For example, the program state of a selected memory cell can be determined by the word line voltage at which the bit line current reaches a particular reference current associated with a particular program state. In contrast, to determine the Vt of a selected memory cell, e.g., memory cell 225-1, the corresponding word line, e.g., word line 221-1, can have a range of sensing voltages applied so that the word line is stepped, e.g., in small voltage difference increments, from a low voltage, e.g., 0 volts (V) to a relatively high voltage, e.g., 6 V. For example, the range of 0-6 V can be covered in 120 steps that each increases by 50 millivolts (mV). The voltage at which the sense output at the corresponding bit line, e.g., bit line 222-1, changes from "0" to "1", e.g., discharges, corresponds to the Vt of the selected memory cell. Advantageously, by measuring the Vt states of the memory cells in steps, the size of state distribution information of a group of memory cells can be reduced. If the analog Vt state of each memory cell was sensed, storing the state distribution information as described herein would utilize a relatively large amount of memory. By sensing the memory cells in steps, the unique analog cell Vt state values do not need to be captured or stored. Instead, the system can merely determine how many memory cells have a Vt state within a particular step, and store that number (e.g., in a particular disjoint group or bin of a histogram), as opposed to each memory cell Vt value individually.

It can be useful, in particular for a selected memory cell and/or a page, block, etc., of memory cells, to compare a determined Vt for each memory cell, a distribution of Vts for the plurality of memory cells, and/or program states thereof to an intended program state for that memory cell and/or page, block, etc., of memory cells. As such, a number of buffers 234-1, . . . 234-M each can be coupled to a respective local bit line 222-1, . . . 222-M that serves as a sense line. Each buffer can include instructions and/or memory, e.g., stored on the die in a memory device, to enable Vt and/or program state analysis and/or to facilitate execution of error determination during a write and/or read operation, as described herein. Such error determination may trigger a failure analysis including sensing of state information and storing of that state information according to the various embodiments described herein.

An example of the sensing circuitry 110 illustrated in FIG. 1 is described further below in association with the buffers shown in FIG. 2 at 234-1, . . . 234-M. For instance, in a number of embodiments, the buffer 234 can include a sense amplifier (sense amp) (not shown) and a number of other components, which can be used to perform logical operations on the die, e.g., on data associated with a corresponding sense line, that is, a local bit line. As such, data storage, collection, update, exchange, and/or comparison functions can be performed by executing instructions stored in the buffer 234 rather than and/or in addition to being performed by processing resources external to the buffer 234, e.g., by a number of processors associated with the controller 106, the host 108, and/or other processing circuitry located elsewhere.

The sense amp in the buffer 234 can be coupled to at least one corresponding local bit line corresponding to a particular column of memory cells. The sense amp can be operated to determine a program state, e.g., a logic data value, stored in a selected memory cell. Embodiments are not limited to a given sense amp architecture or type. For instance, the sensing circuitry 110 in accordance with a number of embodiments described herein can include current-mode sense amps and/or single-ended sense amps, e.g., sense amps coupled to one sense line, among others. A sense amp can amplify a signal associated with conduction caused by discharge of a selected memory cell, e.g., sensing a voltage and/or current change on a bit line coupled to a selected memory cell in order to determine the program state and/or the Vt of a number of selected memory cells by sensing when the selected memory cells begin to conduct. In one or more embodiments, the sense amp also can be used as an amplifier to sense conduction of selected memory cells during a standard read operation.

The buffer 234 can include a number of latches (not shown). The latches can operate in association with, for example, address circuitry to latch address signals provided over an I/O bus, e.g., a data bus, through I/O circuitry. Address signals can be received and decoded by, for example, a row decoder and a column decoder to access an array of memory cells. Data can be read from the array by sensing voltage and/or current changes on the sense lines using the sense circuitry 116, e.g., including the sense amp. The sensing circuitry 110 can read and latch a page, e.g., a row, of data from the array in a particular latch.

Figure 3:
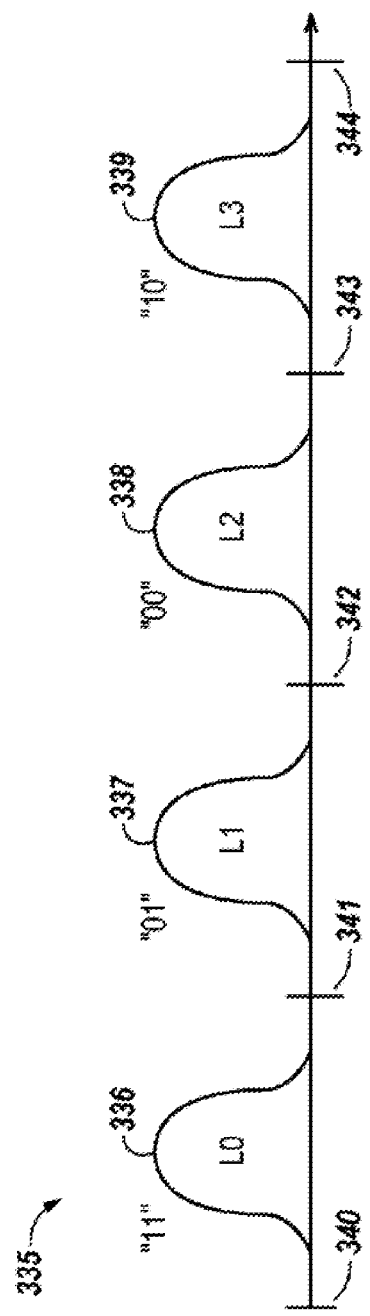
FIG. 3 is a diagram illustrating a number of Vt distributions corresponding to program states associated with programmed memory cells in accordance with an embodiment of the present technology.

FIG. 3 is a diagram 335 illustrating a number of Vt distributions corresponding to program states associated with programmed memory cells in accordance with one or more embodiments of the present disclosure. In an embodiment, to find the Vt of a particular memory cell, the word line can be stepped from a lower, e.g., lowermost, voltage to a higher, e.g., uppermost, voltage, sensing the memory cell at every step. The point at which the sense output changes, e.g., from a "1" to a "0", corresponds to the Vt of that memory cell. To analyze Vts, it can be useful to compare the sensed Vts of a number of memory cells throughout a range of sensing voltages to the particular program state in which each of the memory cells was intended to be, e.g., 11, 01, 00, and 10 in the case of the four-state MLC illustrated in FIG. 3. The memory cells associated with FIG. 3 can be memory cells such as memory cells 225-1, . . . 225-N described herein with regard to FIG. 2. The memory cells associated with FIG. 3 are two-bit, e.g., four-state, MLCs. However, embodiments of the present disclosure are not limited to this example.

In a sensing operation performed on a selected memory cell in a NAND string, the unselected memory cells of the string are biased so as to be in a conducting state. In such a sensing operation, the program state of the selected memory cell can be determined based on the current and/or voltage sensed on the bit line corresponding to the string in response to a particular sensing voltage applied to the corresponding word line that matches or exceeds the Vt for the selected memory cell. For instance, the program state of the selected memory cell can be determined based on whether the bit line current changes by a particular amount or reaches a particular level in a given time period.

The Vt distributions 336, 337, 338, and 339 of FIG. 3 correspond to a number of memory cells each programmed to one of four program states, e.g., e.g., 11, 01, 00, and 10 corresponding to L0, L1, L2, and L3. That is, the x-axis corresponds to a sensing voltage at which a memory cell indicates a response (e.g., the voltage threshold at which the sense output of a memory cell changes), and the y-axis corresponds to the number of memory cells with a threshold voltage corresponding to that sensing voltage. In one or more embodiments, the different program states of L0 and L1 can, for example, be combined to be considered as a lower level and the different program states of L2 and L3 can be combined to be considered as an upper level. Alternatively, each of L0, L1, L2, and L3 can be considered as a separate level for Vt analysis.

As shown in FIG. 3, Vt distribution 336 corresponds to a number of memory cells that are programmed to a first program state, e.g., L0. In at least some embodiments, programming a memory cell to the first program state may simply include allowing a memory cell to remain in an erased state. That is, the first program state may actually be the erased state for both the upper page and the lower page. Vt distribution 337 can correspond to a number of memory cells that are programmed from an erased state, which could be the same as the first program state L0, to a second program state, e.g., L1. A first preprogrammed read reference voltage 341, e.g., which can be higher than a ground state voltage 340, can be applied thereto through the corresponding word line in an attempt to verify, e.g., sense or read, that the program state of the selected memory cell does not remain at L0, e.g., is at least at L1.

However, Vt tails can, for example, extend from the upper end of the L0 distribution shown at 336 and the lower end of the distribution shown at 337, e.g., due to broadening of a voltage level range stored by at least some memory cells for each program state and/or a center of one or more such distributions can be shifted to the left resulting from being written at an elevated ambient temperature, e.g., at an upper end of a measured temperature range and/or markedly higher than an ambient read temperature, or shifted to the right resulting from being written at a lowered ambient temperature. Such a marked difference between the write temperature and the read temperature can affect the Vts of the memory cells relative to a programmed read reference voltage, e.g., as shown at 341, intended to read the memory cells, e.g., at an ambient temperature between these temperatures. Moreover, the actual voltage of an applied read reference voltage may vary based upon a marked temperature difference between the temperature at which the read reference voltage was programmed and the temperature of the circuitry to which the read reference voltage is applied. For example, a read reference voltage programmed for use at an intermediate temperature may actually result in application of a higher voltage or a lower voltage when used with word lines, memory cells, and other circuitry at markedly higher or lower temperatures. As such, the Vt distributions of memory cells read at markedly elevated or lowered ambient temperatures may result in read errors when using a read reference voltage not programmed for sensing in such a temperature range. Such errors may be detected as described herein, so that the memory can undergo a calibration and/or error correction process. As further described herein, the system may also sense and store a Vt distribution (e.g., the diagram 335) in response to such detected errors.

FIGS. 4A and 4B show diagrams for an eight (8) state Vt distributions corresponding to program states associated with programmed memory cells in accordance with one or more embodiments of the present disclosure. The sensing circuitry 110 of FIG. 1, for example, can sense such eight state memory cells of a region of a memory device to yield a Vt distribution diagram as shown. FIGS. 4A and 4B correspond to one or more pages of TLC memory cells. FIGS. 4A and 4B show voltage levels along a horizontal direction or axis.

FIG. 4A shows an example of a Vt distribution for a memory system that may not have errors and/or be in a failure mode. The distribution diagram 402 shows a well-defined distribution of memory states L0 through L7 corresponding to a memory device operating correctly without error or failure, where the sensed Vt state of memory cells for each of L0 through L7 are clearly separated by the threshold voltage levels v1 to v7. Although the example of FIG. 4A shows the distribution for one or more pages of TLC memory cells, Vt distribution information may also be sensed for a specific logical or stored value, a word-line group, a word line, a block, a superblock, a die, or a combination thereof.

For TLC memory cells, such as those exemplified in FIGS. 4A and 4B, each of the memory cells (e.g., the memory cells 122 of FIG. 1) can store three bits. Storage of three bits can equate to eight possible content values of 0-7 or bit values of "000", "001", "010", "011", "100", "101", "110", and "111". Each of the possible content values is identified with level identification, such as L0-L7, in FIGS. 4A and 4B. The assignment of the bit values to specific voltage ranges can be predetermined by the memory system 100, a developer or a manufacturer, a standard or a template, or a combination thereof. The distribution diagram 402 can further include or represent distribution valleys 406. The distribution valley 406 is a representation of a relationship between adjacent distribution targets. The distribution valley 406 can represent an intersection, a separation, an overlap, or a combination thereof between two adjacent distribution targets. The distribution valleys 406 can each be between, at the boundary of, or a combination thereof between two adjacent instances of the levels L0-L7. The distribution valley 406 can be where one or more of the levels L0-L7 cross a threshold level or quantity. In various embodiments, the distribution valleys 406 may have low counts of memory cells when a memory device is functioning properly, and relatively higher counts memory cells when a memory device is in error and/or failure (e.g., as shown in FIG. 4B).

For TLC pages, such as exemplified in FIGS. 4A and 4B, there can be 7 valleys 406 at the voltage levels v1-v7.

FIG. 4B shows a distribution diagram 410. The distribution diagram 410 can be a histogram showing a number of memory cells 122 having a particular sensed state. The distribution diagram 410 shows a Vt distribution that may correspond to a memory device experiencing an error and/or failure. The valley at voltage level v2 is not very distinct, as memory cells sensed at a v2 voltage level may have been programmed to be set in state L1 or L2. If such an error is detected by the memory device, the memory device may sense the state of each memory cell in a subset of the total memory cells and store that state distribution information (e.g., the distribution information in FIG. 4B) in a persistent memory, in accordance with various embodiments of the present technology. In this way state distribution information about the memory cells in error is captured at or near the time the error/failure was detected. Such state distribution information can be utilized as described herein for diagnosing the problem with a memory device, recovering the data stored on the memory device, calibrating other memory devices that are exposed to similar conditions of the memory device having an error and/or experiencing a failure, or any combination thereof. Note that other levels Vt distributions have also shifted, but none appear to have an error at the magnitude shown at the threshold v2 for levels L1 and L2.

Figure 5:
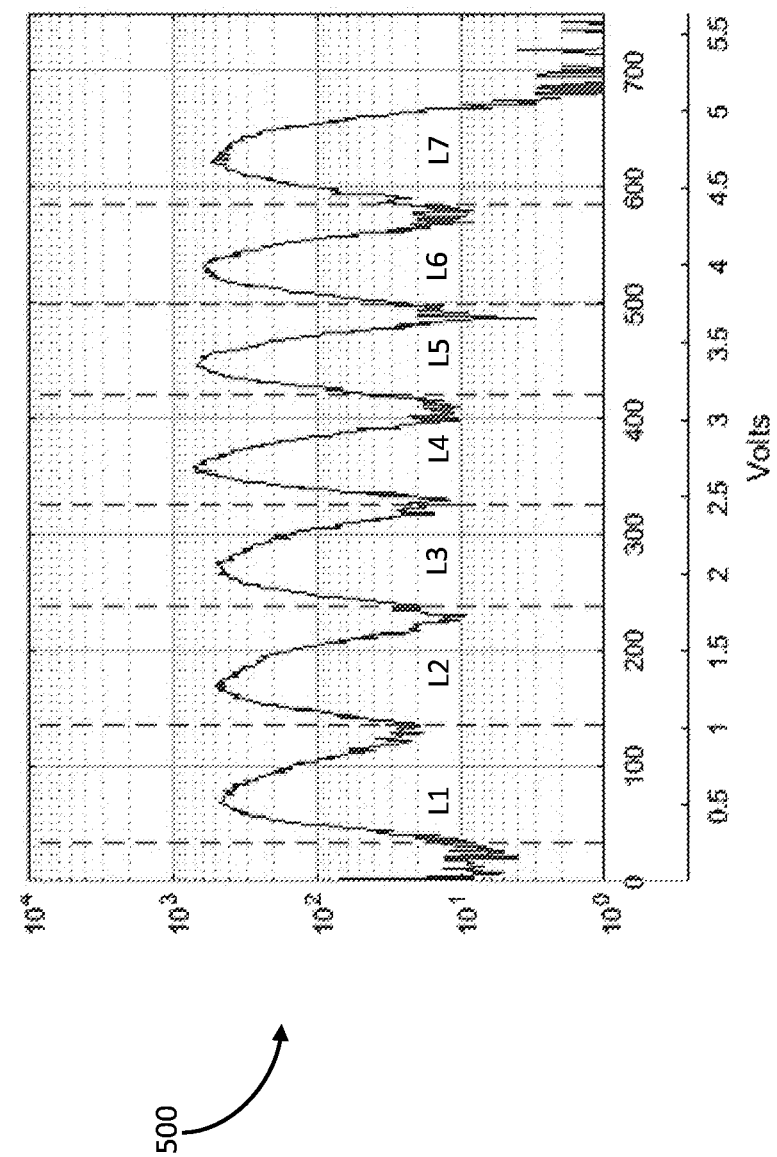
FIG. 5 is a histogram showing a number of actual Vt distributions corresponding to program states associated with programmed memory cells in accordance with an embodiment of the present technology.

FIG. 5 is a histogram 500 showing a number of actual Vt distributions corresponding to program states associated with programmed memory cells in accordance with an embodiment of the present technology. The histogram 500 shows relatively desired Vt distributions, such that an error and/or failure may not be occurring. As discussed herein, instead of measuring and storing the state information of every memory cell individually, the system may sense the states in steps. That is, the system may count how many memory cells change states when the voltage applied is increased by a predetermined amount (e.g., 10 mV, 20 mV, 50 mV, 100 mV, etc.). In this way the memory cells can be grouped according to the stepped amounts. For example, if the step amount is 50 mV, the memory device may determine for level L2, (1) the number of memory cells that change state when a sensing voltage is anywhere from 1.00 V to 1.05 V, (2) the number of memory cells that change state when a sensing voltage is anywhere from 1.05 V to 1.10 V, (3) the number of memory cells that change state when a sensing voltage is anywhere from 1.10 V to 1.15 V, and so on up to about 1.75 V. Such a method for sensing states of the memory cells may also be used for the other levels L0, L1, and L3 to L7. In this way, the state distribution information stored in persistent memory to be used for failure analysis does not take up as much memory as storing the value at which every sensed memory cell changed state. Instead, only the number of memory cells that changed state within a given step value range are stored. This can also allow more distribution information to be stored in persistent memory, such as Vt distribution state information on other memory pages in a memory device. These step value ranges can be changed or varied to impact how much memory is needed to store the Vt distribution state information. For example, larger step value ranges and fewer total number of step sweep levels will utilize less memory. In some embodiments, step sweep levels may utilize different range sizes. For example, for areas closer to a suspected valley between level values (e.g., at the valleys 406 of FIG. 4A), smaller range sizes may be utilized to give greater resolution. For areas closer to the middle of expected levels (between suspected valleys), larger range sizes may be utilized. In this way, greater resolution is provided near expected valleys where memory cells may be more likely to have an error.

Figure 6:
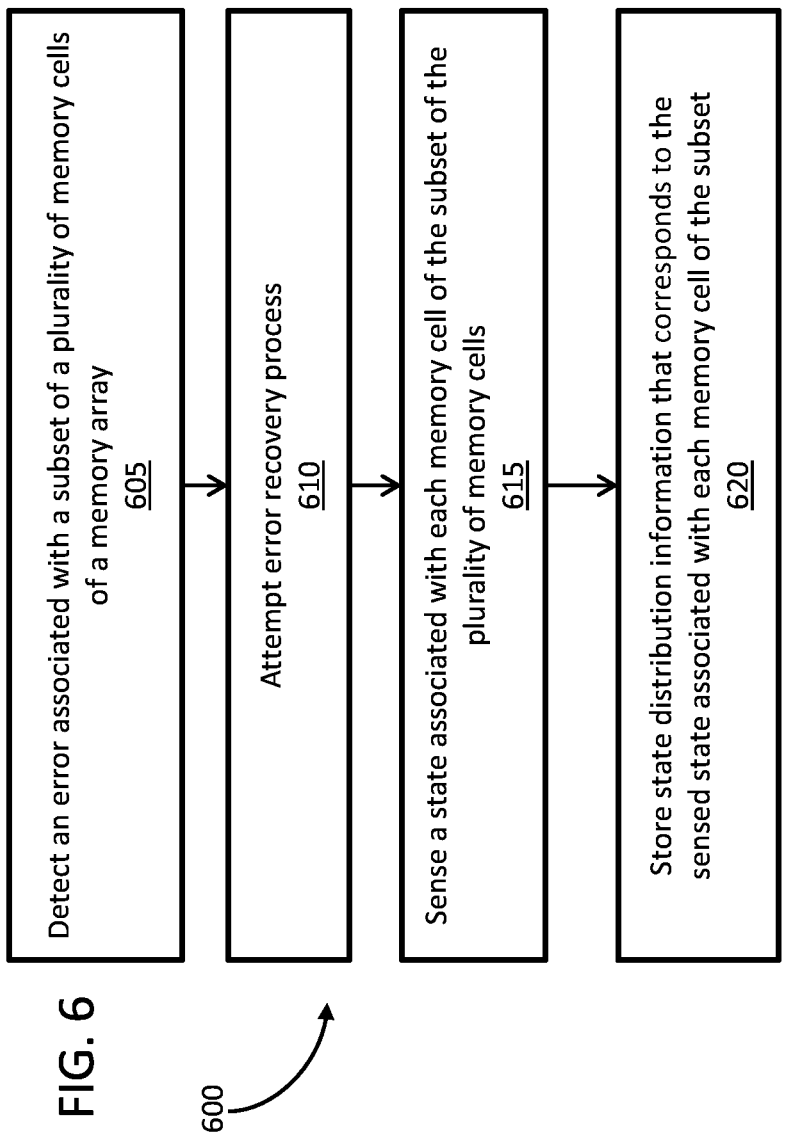
FIG. 6 is a flow diagram illustrating a method for performing real time block failure analysis in accordance with an embodiment of the present technology.

FIG. 6 is a flow diagram illustrating a method 600 for performing real time block failure analysis in accordance with an embodiment of the present technology. In an operation 605, an error is detected associated with a subset of a plurality of memory cells of a memory array. The memory array may be, for example, the memory device 102 of FIG. 1. The subset of the plurality of memory cells may be, for example, a memory block, a memory word line, a memory page, or any other subset of memory cells of a memory device. In one embodiment, the subset of memory cells may be all the memory cells of a memory device.

In an operation 610, an error recovery process is attempted. For example, a RAIN error recovery process may be attempted. Other error recovery processes may include a calibration of the memory array. In an alternative embodiment, no error recovery process may be attempted after detecting an error at the operation 605.

In an operation 615, a state associated with each memory cell of the subset of the plurality of memory cells is sensed in response to the detection of the error associated with the subset of the plurality of memory cells. In this way, the states of the memory cells experiencing an error can be determined/sensed at or near the time of the error. In some embodiments, the sensing of the states associated with the subset of memory cells may also occur in response to a failure of the attempted error recovery process at the operation 610. In other words, in an embodiment, the distribution information capture may happen only if one or more error recovery processes fails. In this way, the amount of processing used to capture state distribution information and the amount of memory used to store that state distribution information is kept to a minimum. In an alternative embodiment, the sensing of the states associated with the subset of memory cells may occur in the absence of the detection of an error, in the absence of an error recovery process being attempted, or both. That is, sensing of the states of the memory cells may occur before an error is detected and/or before an error recovery process is initiated. In some embodiments, the sensing of the states of the memory cells may occur after an error is detected but before an error recovery process is initiated. In some embodiments, where a memory device utilizes multiple error recovery processes, the sensing of the states of the memory cells may occur in between any of the multiple error recovery processes. For example, the sensing of states may occur after various calibration and/or preliminary error recovery processes, but immediately before a RAIN error recovery process. In some embodiments, the memory device may sense and store state distribution information at multiple points throughout operation, error detection, error recovery processes, or any combination thereof. The sensing of the memory cells may occur at the memory device, for example by the sensing circuitry 110 of FIG. 1. In some embodiments, the sensing may be software based, may occur in the in host 108, in a different memory device, another location, or a combination thereof.

Advantageously, the state associated with each memory cell of the subset of memory cells can be sensed prior to a powering off the memory device. In this way, the states of the memory cells as they were at or near the time of the error and/or failure is better captured. In various embodiments, the state associated with each of the memory cells of the subset are sensed within a predetermined threshold of time from detection of the error and/or within a predetermined threshold of time of one or more of the failed error recovery processes. This predetermined threshold of time may be a predetermined length of time in seconds or a fraction of a second, or may be defined in terms of a number of clock cycles internal to the memory device and/or host.

In an operation 620, the sensed state distribution information is stored in a persistent (or non-volatile) memory. The state distribution information corresponds to the sensed state associated with each memory cell of the subset. The state distribution information can be stored in persistent memory so that it can be accessed or sent to another device at a later time, including, for example, after the memory device has been powered off. In various embodiments, the stored state distribution information includes the sensed state associated with each memory cell of the subset in a corresponding disjoint category of a histogram. The disjoint categories that each sensed memory cell corresponds are also referred to herein as the stepped value ranges. As disclosed herein, the subset of the plurality of memory cells is one of a page of memory cells, a block of memory cells, a word line group of memory cells, a plane of memory cells, a die of memory cells, or any combination thereof. In some embodiments, the system may store state distribution information in a non-persistent (or volatile) memory instead of or in addition to storing it in a persistent memory. In various embodiments, the state distribution information may also be sent to or passed outside of the memory device through a debug port and/or another interface (e.g., an interface of the host).

Figure 7:
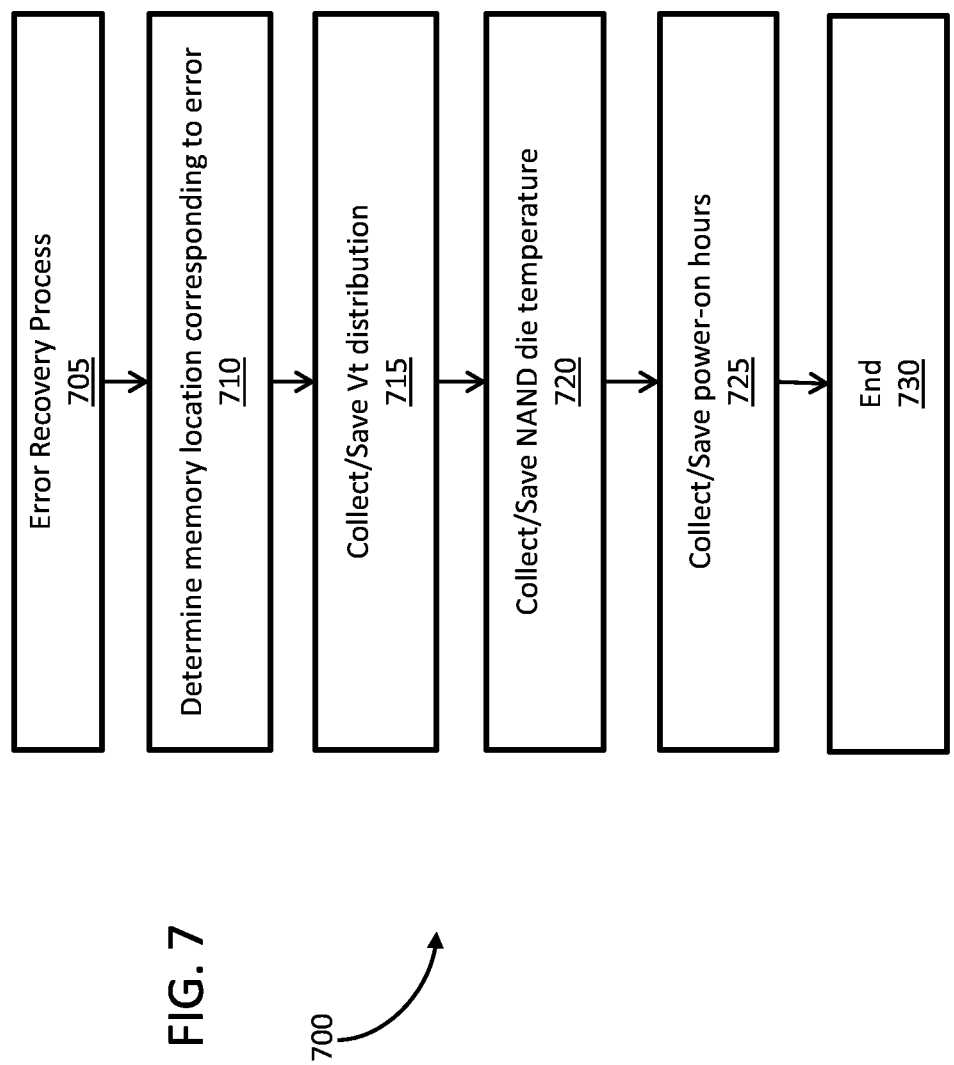
FIG. 7 is a flow diagram illustrating another method for performing real time block failure analysis in accordance with an embodiment of the present technology.

FIG. 7 is a flow diagram illustrating another method 700 for performing real time block failure analysis in accordance with an embodiment of the present technology. In an operation 705, an error recovery process is implemented. In an operation 710, a location of the memory cells corresponding to the error recovery process is determined. This identification step pinpoints an error, such that the sensing and storing of states focuses on an area of a memory device where the error actually occurs. In this way, processing power utilized to sense the states of the memory devices and memory space utilized to store that state distribution information is minimized.

In an operation 715, the Vt distribution information for the memory cells in the memory location where the error occurred is sensed/collected and saved as described herein. Location information indicating where the error occurred (e.g., where the page of memory cells for which the state information was collected) can also be saved/stored in the persistent memory along with the state distribution information. This location information indicates the physical location of the subset of memory cells for which state information was collected saved.

In an operation 720, the NAND die temperature is sensed/collected and saved. If a memory device is powered off, the memory device may cool down. By sensing and recording the temperature at or near a time of error and/or failure, as well as before the memory device is powered down, a useful temperature measurement can be retained for further failure analysis. Because the temperature of a memory device can contribute to errors and/or failures as discussed herein, such information is valuable when performing failure analysis. Similarly, at an operation 725, power-on hours of the memory device is also collected/sensed and saved along with the state distribution information. This power-on time is also determined at or near the time of error and/or failure for at least the same reasons as for capturing the die temperature. At an operation 730, the method 700 ends.

The die temperature, the location information, and the power-on hours are collectively referred to herein as additional information associated with the plurality of memory cells for which state distribution information is sensed and stored. This additional information is stored along with the state distribution information in persistent memory in response to detection of an error and/or failure. The additional information is stored such that it is associated with the subset of memory cells for which the state distribution information was sensed and stored. In this way, during a subsequent failure analysis, the additional information can be considered for determining a cause and or remedy for the error/failure. Other additional information may also be determined/sensed/collected and saved along with the state distribution information. Examples of other additional information may include a number of program operations completed with respect to at least one of the subset of the plurality of memory cells, a number of erase operations performed with respect to at least one of the subset of the plurality of memory cells, a combined number of erase and program operations performed with respect to the subset of the plurality of memory cells, a number of read operations performed with respect to at least one of the subset of the plurality of memory cells, a read reference voltage associated with the subset of the plurality of memory cells, a type of error recovery process attempted prior the state associated with each memory cell of the subset being sensed, or any combination thereof.

In addition to the state information for a subset of memory cells that has experienced an error, in some embodiments of the present disclosure state information may be immediately or near-immediately collected for other subsets. For example, subsets of memory cells that can potentially have influenced the failure of another subset of memory cells may similarly be subject to the collection of state information (e.g., in addition to collecting the state information for a failing page, physically adjacent pages, pages with addresses immediately or shortly before and/or after the failing page, pages including floating gates coupled to the failing page, etc., may be subject to the collection of state information). In accordance with one aspect of the present disclosure, the feature of collecting state information for subsets of memory cells in addition to the failing subset may be enabled or disabled by a firmware setting, a mode register setting, a vendor-specific command, or the like.

The number of pages of memory cells or other subset of memory cells for which state distribution information may be saved may be limited by an amount of persistent memory available in the memory device for storing such state distribution information. Accordingly, in one embodiment, once the persistent memory is full, the system may no longer perform the state distribution sensing and storage operations described herein. In another embodiment where the persistent memory is full, the system may replace an oldest or newest state distribution information stored in the persistent memory. Accordingly, a time and/or date at which state distribution information is sensed and stored may also be stored in persistent memory as part of the additional information. In this way, the system can keep track of which stored state distribution information is oldest. In some embodiments, the system may perform some processing to determine which state distribution to replace/erase when the persistent memory is full. For example, if state distribution information has been captured multiple times for the same subset of memory cells in a memory device, the system may opt to replace/erase the state distribution information of that subset that occurred either most recently or longest ago in time. In another example, the system may determine if two sets of state distribution information for the same subset of memory cells was sensed within a predetermined time of one another. If the same subset has been sensed twice or more close together (in less than the predetermined time), the subsets may be considered for purposes of memory management to be duplicates and therefore one of those duplicates can be replaced/erased to make way for new state distribution information. In some embodiments, the system may also determine whether state distribution information has been exported, sent to another device, viewed or downloaded by a user, etc. before erasing/replacing it. In this way, the system may only replace/erase state distribution information that presumably has already been analyzed or has been duplicated on another device (so there is no utility in continuing to store it on the memory devices persistent memory).

Figure 8:
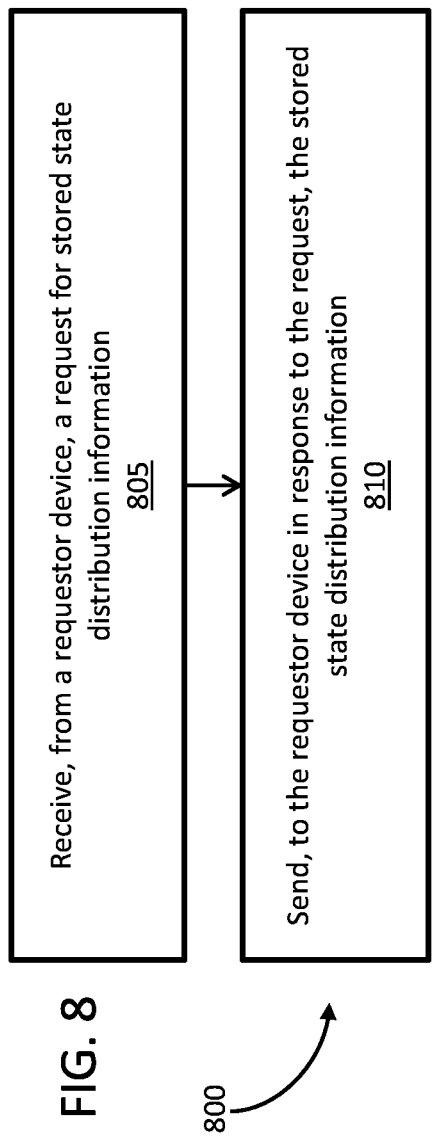
FIG. 8 is a flow diagram illustrating a method for delivering state distribution in accordance with an embodiment of the present technology.

FIG. 8 is a flow diagram illustrating such a method 800 for delivering state distribution in accordance with an embodiment of the present technology. In an operation, a memory device receives, from a requestor device, a request for state distribution information stored in memory of the memory device (e.g., persistent memory). In an operation 810, the memory device sends, to the requestor device in response to the request, the state distribution information stored in the memory. The requestor device may be a host device, such as the host 108 of FIG. 1. The requestor device may also be another memory device. The requestor device may also be any other device, such as a computing device connected to the memory device and/or host device through a network.

Figure 9:
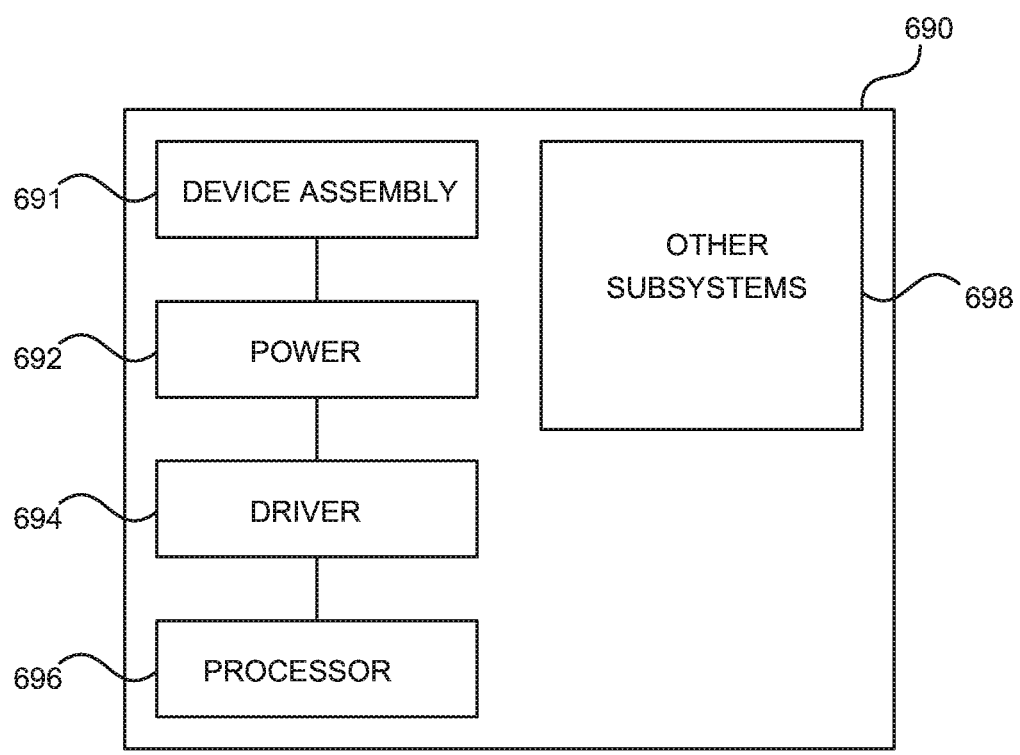
FIG. 9 is a schematic view of a system that includes a memory device in accordance with embodiments of the present technology.

FIG. 9 is a schematic view of a system that includes a memory device in accordance with embodiments of the present technology. Any one of the foregoing memory devices described above with reference to FIGS. 1-8 can be incorporated into any of a myriad of larger and/or more complex systems, a representative example of which is system 690 shown schematically in FIG. 9. The system 690 can include a semiconductor device assembly 691, a power source 692, a driver 694, a processor 696, and/or other subsystems and components 698. The semiconductor device assembly 691 can include features generally similar to those of the memory device described above with reference to FIGS. 1-8, and can, therefore, include various features that sense state information of memory cells in response to detection of an error and store state distribution of the sensed memory cells. The resulting system 690 can perform any of a wide variety of functions, such as memory storage, data processing, and/or other suitable functions. Accordingly, representative systems 690 can include, without limitation, hand-held devices (e.g., mobile phones, tablets, digital readers, and digital audio players), computers, vehicles, appliances, and other products. Components of the system 690 may be housed in a single unit or distributed over multiple, interconnected units (e.g., through a communications network). The components of the system 690 can also include remote devices and any of a wide variety of computer readable media.

From the foregoing, it will be appreciated that specific embodiments of the invention have been described herein for purposes of illustration, but that various modifications may be made without deviating from the disclosure. For example, in one embodiment, the sensing circuitry 110 (FIG. 1) can sense and store state distribution information with or without a command to do so from the host 108 and/or the controller 106. The sensing circuitry 110 can select the memory regions to be sensed, for example, based on factors such as the number of times a memory region has been read, erased, and/or written to; the amount of time that has elapsed since the memory region was last calibrated; random sampling (e.g., of one or more memory pages within a memory block, of one or more memory blocks within a memory unit, etc.); and/or in accordance with a predefined order of memory regions. In these and other embodiments, a single component (e.g., the sensing circuitry 110) of the system 101 (FIG. 1) can perform the various methods discussed herein. In addition, certain aspects of the new technology described in the context of particular embodiments may also be combined or eliminated in other embodiments. Moreover, although advantages associated with certain embodiments of the new technology have been described in the context of those embodiments, other embodiments may also exhibit such advantages and not all embodiments need necessarily exhibit such advantages to fall within the scope of the technology. Accordingly, the disclosure and associated technology can encompass other embodiments not expressly shown or described.

We claim:

1. A system comprising:
 a memory array including a plurality of memory cells; and
 a processing device coupled to the memory array, the processing device configured to:
  in response to detection of an error associated with a subset of the plurality of memory cells, sense a state associated with each memory cell of the subset of the plurality of memory cells; and
  store state distribution information in a persistent memory, the state distribution information comprising the sensed state associated with each memory cell of the subset,
 wherein sensing the state associated with each memory cell comprises stepping a corresponding word line with a plurality of sensing voltages to determine at which sensing voltage a corresponding bitline output changes, and
 wherein storing the state distribution information comprises storing the sensed state associated with each memory cell of the subset in a corresponding disjoint category of a histogram, wherein the corresponding disjoint category of the histogram corresponds to the determined sensing voltage.

2. The system of claim 1, wherein the sensed state of each memory cell of the subset is a threshold voltage (Vt) stored on each memory cell of the subset.

3. The system of claim 1, wherein the state associated with each memory cell of the subset is sensed within a predetermined threshold of time from detection of the error.

4. The system of claim 1, wherein the state associated with each memory cell of the subset is sensed prior to powering off the memory device.

5. The system of claim 1, wherein the processing device is further configured to sense the state associated with each memory cell of the subset in response to a determination that an error recovery process has failed.

6. The system of claim 1, wherein the processing device is further configured to:
 receive a request for the state distribution information stored in the persistent memory; and
 send the state distribution information stored in the persistent memory.

7. The system of claim 1, wherein the processing device is further configured to store, in the persistent memory, location information indicating a physical location of the subset of the plurality of memory cells within the plurality of memory cells.

8. The system of claim 1, wherein the subset of the plurality of memory cells is one of a page of memory cells, a block of memory cells, a word line group of memory cells, a plane of memory cells, and a die of memory cells.

9. The system of claim 1, wherein the processing device is further configured to:
   determine, in response to detection of the error, additional information associated with the plurality of memory cells; and
   store the additional information in the persistent memory and associate the additional information with the state distribution information.

10. The system of claim 9, wherein the additional information comprises at least one of:
    a die temperature of the memory device,
    a power-on time of the memory device,
    a number of program operations completed with respect to at least one of the subset of the plurality of memory cells,
    a number of erase operations performed with respect to at least one of the subset of the plurality of memory cells,
    a combined number of erase and program operations performed with respect to the subset of the plurality of memory cells,
    a number of read operations performed with respect to at least one of the subset of the plurality of memory cells,
    a read reference voltage associated with the subset of the plurality of memory cells, and
    a type of error recovery process attempted prior the state associated with each memory cell of the subset being sensed.

11. The system of claim 1, wherein the processing device is further configured to sense the state associated with each memory cell of the subset prior to implementation of an error recovery process.

12. A method for storing state information of a memory region of a system, the method comprising:
    sensing, in response to detection of an error associated with a subset of a plurality of memory cells of the system, a state associated with each memory cell of the subset of the plurality of memory cells; and
    storing state distribution information in a persistent memory, the state distribution information comprising the sensed state associated with each memory cell of the subset,
    wherein sensing the state associated with each memory cell comprises stepping a corresponding word line with a plurality of sensing voltages to determine at which sensing voltage a corresponding bitline output changes, and
    wherein storing the state distribution information comprises storing the sensed state associated with each memory cell of the subset in a corresponding disjoint category of a histogram, wherein the corresponding disjoint category of the histogram corresponds to the determined sensing voltage.

13. The method of claim 12, wherein the sensed state of each memory cell of the subset is a threshold voltage (Vt) stored on each memory cell of the subset.

14. The method of claim 12, wherein the state associated with each memory cell of the subset is sensed within a predetermined threshold of time from detection of the error.

15. The method of claim 12, further comprising:
    receiving a request for the state distribution information stored in the persistent memory; and
    sending the state distribution information stored in the persistent memory.

16. A non-transitory computer readable medium having instructions stored thereon that, upon execution by a computing device, cause the computing device to perform operations, wherein the instructions comprise:
    instructions to sense, in response to detection of an error associated with a subset of a plurality of memory cells of a system, a state associated with each memory cell of the subset of the plurality of memory cells; and
    instructions to store state distribution information in a persistent memory, the state distribution information comprising the sensed state associated with each memory cell of the subset,
    wherein the instructions to sense the state associated with each memory cell comprise instructions to step a corresponding word line with a plurality of sensing voltages to determine at which sensing voltage a corresponding bitline output changes, and
    wherein the instructions to store the state distribution information comprise instructions to store the sensed state associated with each memory cell of the subset in a corresponding disjoint category of a histogram, wherein the corresponding disjoint category of the histogram corresponds to the determined sensing voltage.

17. The non-transitory computer readable medium of claim 16, wherein the instructions further comprise instructions to determine that an error recovery process has failed, and wherein the sensing of the state associated with each memory cell of the subset is performed in response to the determination that the error recovery process has failed.

18. The non-transitory computer readable medium of claim 16, wherein the instructions further comprise instructions to store, in the persistent memory, location information indicating a physical location of the subset of the plurality of memory cells within the plurality of memory cells.

* * * * *